United States Patent [19]

Tsushima et al.

[11] Patent Number: 5,391,442
[45] Date of Patent: Feb. 21, 1995

[54] METHOD OF FORMING COLOR PATTERN ON A POLYSILANE LAYER

[75] Inventors: Hiroshi Tsushima, Takatsuki; Iwao Sumiyoshi, Osaka; Masaaki Yokoyama, Toyonaka, all of Japan

[73] Assignee: Nippon Paint Co., Ltd., Osaka, Japan

[21] Appl. No.: 4,613

[22] Filed: Jan. 14, 1993

[30] Foreign Application Priority Data

Jan. 14, 1992 [JP] Japan .................. 4-004539
Mar. 26, 1992 [JP] Japan .................. 4-068243

[51] Int. Cl.⁶ .............................. G03F 9/00
[52] U.S. Cl. ........................ 430/7; 430/15; 430/293; 430/321
[58] Field of Search .......... 430/7, 4, 15, 293, 321

[56] References Cited

U.S. PATENT DOCUMENTS 5,059,500  10/1991  Needham et al. .......... 430/7

FOREIGN PATENT DOCUMENTS 2926189   6/1979  Germany .
55-06342  7/1978  Japan .
59-182408 7/1979  Japan .

OTHER PUBLICATIONS

"Selective Dyeing of Organopolysilane Films Patterned by Ultra-Violet Light Irradiation"; M. Yokoyama, et al.; Chemistry Letters, pp. 1163-1566; 1991.

*Primary Examiner*—Steve Rosasco
*Attorney, Agent, or Firm*—Townsend & Banta

[57] ABSTRACT

The present invention provides the color pattern forming method wherein the process is simple and therefore the product can be manufactured at a low cost and it is possible to obtain an RGB color filter with superior pattern precision.

7 Claims, 1 Drawing Sheet

METHOD OF FORMING COLOR PATTERN ON A POLYSILANE LAYER

FIELD OF THE INVENTION

The present invention is related to a method of forming the color pattern on a transparent substrate, particularly a method of manufacturing a color filter for color liquid crystal displays.

BACKGROUND OF THE INVENTION

The demand for the color liquid crystal display which employs liquid crystal as the optical shutter is rapidly increasing. There are two types of color liquid display being developed at present; one is a simple matrix driving system and the other is an active matrix driving system. In either case, the color filter is an important element which governs their performance.

The main methods of the manufacture of color filter include dyeing method, color resist method, electrodeposition method and printing method.

Among these manufacturing methods for color filters, the dyeing method, color resist method and electrodeposition methods require a photo-lithography process which includes wet developing step for each color, to produce 3 RGB (red, green and blue) primary colors on the filter material. Therefore the manufacturing step becomes complicated, yield is low and cost reduction is difficult.

The printing method does not require a photolithography step and its process is relatively simple, but in this method, the position of the RGB pattern to be formed can not be precisely controlled. Therefore a disturbance of pattern occurs due to swelling or thinning of the edge section of the black matrix.

Thus it has been desired to develop a color pattern forming method which provides a color filter with superior pattern precision.

On the other hand, a pattern dyeing method using silanol groups produced by UV irradiation of organic polysilane is described in "Masaaki Yokoyama et al, Chemistry Letters, page 11-63-1566, 1991". This literature tries to introduce the mechanism of the phenomena that when an organic polysilane layer is irradiated by UV radiation, the part of the polysilane layer exposed to UV radiation indicates a superior dyeing property to specific dyes.

The literature suggests the application of such dyeing method to the manufacture of color filters. However, it does not describe the example where polysilane layer is dyed in multi-colors.

SUMMARY OF THE INVENTION

The present invention provides a color pattern forming method wherein the process is simple and therefore the product can be manufactured at a low cost and it is possible to obtain an RGB color filter with superior pattern precision.

The present invention thus provides a method of forming a multi-color dyed pattern on a polysilane layer comprising the following steps:

a) a latent image forming step to form a latent image of dyed pattern by selectively exposing a polysilane layer formed on a substrate to UV radiation said polysilane layer comprising polysilane with the chemical structure indicated by the formula;

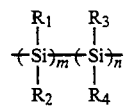

wherein, $R_1$, $R_2$, $R_3$ and $R_4$ respectively are selected from the group consisting of a substituted or non-substituted aliphatic hydrocarbon group, an alicyclic hydrocarbon group and an aromatic hydrocarbon, m and n are integral numbers b) a pattern dyeing step wherein said polysilane layer on which the latent image of dyed pattern is formed in step a) is immersed in a dye bath containing at least one kind of basic dye, and c) another pattern dyeing step process conducted at least once in the same way as in the aforesaid pattern dyeing step b); except that the images of different dyed patterns are formed in said polysilane layer and different types of basic dye are used (the first embodiment).

The present invention also provides a method of conducting the aforesaid process b) not by the dye bath containing basic dyes, but by a coloring sol solution made of metal alkoxide containing at least one type of dye or pigment (the 2nd embodiment).

DETAILED DESCRIPTION OF THE INVENTION

Figure 1A:
FIG. 1(a-f) is the schematic drawing to indicate the pattern dyeing process steps of the present invention.

The polysilane used in the present invention is a polysilane having the chemical structure represented by the formula,

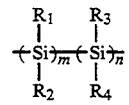

wherein $R_1$, $R_2$, $R_3$ and $R_4$ respectively are selected from the group consisting of a substituted or non-substituted aliphatic hydrocarbon group (such as a methyl group, a n-propyl group, a n-butyl group, a n-hexyl group, a phenylethyl group, a trifluoropropyl group and a nonafluorohexyl group), a substituted or non-substituted aromatic hydrocarbon group (such as a p-tolyl group, a biphenyl group, and a phenyl group) and a substituted or non-substituted alicyclic hydrocarbon group (such as a cyclohexyl group and a methylcyclohexyl group), and m and n are integral numbers. The aliphatic hydrocarbon group preferably has 1 to 10 carbon atoms, the alicyclic hydrocarbon group preferably has 6 to 10 carbon atoms and the aromatic hydrocarbon group preferably has 6 to 10 carbon atoms. The substituents of the $R_1$ to $R_4$ preferably include a halogen atom, a hydroxyl group, a nitrile group, a $C_1$-$C_5$ alkoxy group, and the like. The kind of $R_1$-$R_4$ and the value of m and n are not particularly important, as long as such polysilane resin is soluble in an organic solvent and can be coated to produce a transparent uniform thin film 1-10 μm in thickness.

However, generally speaking when the molecular weight of polysilane is lower, the organic solvent resistance of polysilane layer becomes weaker. Therefore, when a polysilane layer is formed with polysilane of low molecular weight, the low molecular weight part of the polysilane layer, in particular, re-dissolves into the dye bath at the time of dyeing, when the amount of organic solvent contained in the dye bath is large or the dyeing conditions such as dyeing temperature or dyeing time are severe. When the polysilane layer partially re-dissolves into the dye bath, pinholes are produced in the dyed polysilane layer. Therefore, the polysilane having a molecular weight of over 10,000 is particularly preferred for the polysilane layer of the present invention.

Such polysilane is prepared, for example, by polymerizing plural or single diorgano-dichlorosilane in toluene or n-decane solvent in the presence of sodium metal at a temperature of 100° C. or above for more than 3 hours.

Preferred polysilane to be used in the present invention may be poly(phenylmethylsilane) when $R_1$ is methyl group and $R_2$ is phenyl group, phenylmethyl-/methyl-trifluoropropyl copolysilane etc., when $R_1$ is methyl group, $R_2$ is phenyl group, $R_3$ is methyl group and $R_4$ is trifluoropropyl group.

Surface disturbance produced by partial re-dissolution of polysilane layer may be prevented by formulating a crosslinking agent into the polysilane layer and thereby improving the organic solvent resistance of polysilane layer. The preferred crosslinking agent to be used for the polysilane layer of the present invention may be a silicone rubber composition which is composed of 100 wt parts of silicone oil having silanol groups at both terminals such as poly(dimethylsiloxane diol), 2-10 parts of tri-functional silane such as acetoxysilane, oximsilane, alkoxysilane, enoxysilane, aminosilane, amidosilane and aminoxysilane, etc. and 0.05-1 parts of metal catalyst such as tin compound and platinum compound. Such silicone rubber composition crosslinks the polysilane layer by condensation reaction caused by moisture and thus improves organic solvent resistance of polysilane layer. The amount of silicone rubber composition in the polysilane layer is preferred to be 0.01-50 wt parts, in particular, 1-10 wt parts as against 100 wt parts of polysilane. When the amount is less than 0.01 wt part, sufficient organic solvent resistance is not acquired, while if the amount of compounding exceeds 50 wt parts, dyeability decreases.

Due to the agglomeration of dyes on the surface of polysilane the layer, pimples occasionally occur. In such case, by using fluorine-based polysilane such as poly(methyltrifluoropropylsilane) having methyl group at $R_1$ and trifluoropropyl group at $R_2$ for the polysilane layer, sticking of dyes to the pimpled surface of polysilane may be prevented.

The dyes used for the first embodiment of the present invention are all types of dyes which are able to do mutual actions such as ion exchange with the silanol group in an aqueous medium. It is considered that such dyes are adsorbed on the filter material by mutual action with silanol groups to be formed in the polysilane layer by UV irradiation. As the result, a filtering material is dyed according to the exposure pattern.

These dyes include basic dyes. Basic dyes are considered to enter into an exchange reaction with silanol group in aqueous solution. According to the present invention, in order to prevent partial re-dissolution of polysilane layer, it is preferred to carry out pattern dyeing at a relatively low temperature. When compared with the case of acid dyes, dyeing with basic dyes is preferred since it has advantages that dyeing can be conducted at such low temperature as 20°-40° C., and even when the dyeing temperature fluctuates in the range of 20°-40° C., adsorption concentration on filter material does not change much. When basic dyes are used, management of dye bath solution is simple and dyeing is inexpensive.

Among the basic dyes, triphenylmethane type or methine type dyes which affect deep color dyeing at low temperature are preferred. The dyes which are particularly preferred for the method of the present invention include the dyes having the chemical structure of the following formulae (I)-(V).

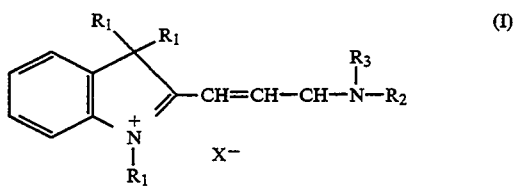

(I)

wherein $R_1$ is an alkyl group, $R_2$ and $R_3$, respectively, are selected from the group consisting of hydrogen, an alkyl group, a substituted alkyl group, a phenyl group and a substituted phenyl group, $X^-$ is the radical selected from a group consisting of halogen ion, perchlorate ion, methyl sulfate ion and phosphate ion,

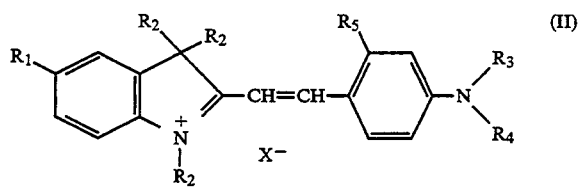

(II)

wherein $R_1$ is selected from the group consisting of hydrogen, an alkyl group, a substituted alkyl group, an alkoxy group and halogen, $R_2$ is an alkyl group and $R_3$ and $R_4$, respectively, are selected from the group consisting of hydrogen, an alkyl group, a substituted alkyl group, a phenyl group and a substituted phenyl group, $R_5$ is an alkyl group, $X^-$ is selected from the group consisting of halogen ion, perchlorate ion, methyl sulfate ion and phosphate ion,

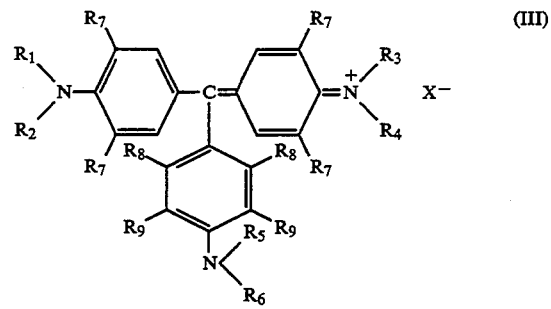

(III)

wherein $R_1$, $R_2$, $R_3$ and $R_4$, respectively, are selected from the group consisting of hydrogen, an alkyl group, a substituted alkyl group, a phenyl group and a substituted phenyl group, $R_7$, $R_8$ and $R_9$, respectively, are selected from the group consisting of hydrogen, an alkyl group, a substituted alkyl group and halogen (aromatic ring may be bonded at $R_8$ and $R_9$), $X^-$ is selected from the group consisting of halogen ion, perchlorate ion, methyl sulfate ion and phosphate ion

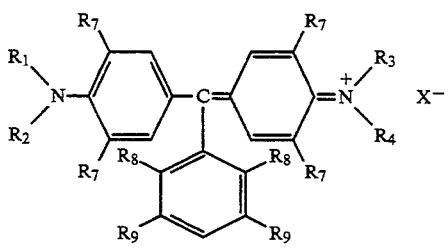

(IV)

wherein $R_1$, $R_2$, $R_3$, $R_4$, $R_5$ and $R_6$, respectively, are selected from the group consisting of hydrogen, an alkyl group, a substituted alkyl group, a phenyl group and a substituted phenyl group, $R_7$, $R_8$ and $R_9$, respectively, are selected from the group consisting of hydrogen, an alkyl group, a substituted alkyl group and halogen (aromatic ring may be bonded at $R_8$ and $R_9$), $X^-$ is selected from the group consisting of halogen ion, perchlorate ion, methyl sulfate ion and phosphate ion

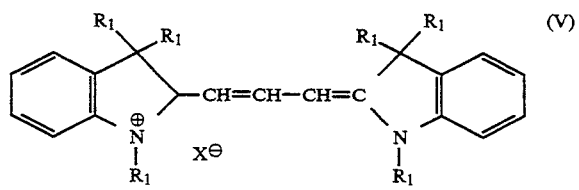

(V)

wherein in the formula, $R_1$ is an alkyl group, $X^-$ is selected from the group consisting of halogen ion, perchlorate ion, methyl sulfate ion and phosphate ion C.I.Nos. of dyes preferred for use in the present invention are given below: Basic Red 12, Basic red 27, Basic violet 7, Basic violet 10, Basic violet 40, Basic blue 1, Basic blue 7, Basic blue 26, Basic blue 77, Basic green 1 and Basic yellow 21.

In the first embodiment, it is preferred that pattern dyeing is repeated one after another starting with the dye having the fastest speed of adsorption on the polysilane layer.

The second embodiment has been made to enlarge the range of selection of colors.

Dyes and pigments preferred for the second embodiment are the dyes and pigments which may be dissolved or dispersed in an alcohol solution of metal alkoxide which include all dyes or pigments being able to do mutual action with silanol group in sol solution. These dyes and pigments are considered an be adsorbed to the filter material by the mutual action with silanol group which is formed in the polysilane layer by UV irradiation. As a result, filter material is colored according to the exposure pattern.

Such dyestuffs include basic dyes, oil soluble dyes and disperse dyes. The examples of C.I.Nos. of dyes preferred for use for the present invention are given below: for basic dyes, Basic red 12, Basic red 27, Basic violet 7, Basic violet 10, Basic violet 40, Basic blue 1, Basic blue 7, Basic blue 26, Basic blue 77, Basic green 1 and Basic yellow 21; for oil soluble dyes, Solvent red 125, Solvent red 132, Solvent red 83, Solvent red 109, Solvent blue 67, Solvent blue 25, Solvent yellow 25, Solvent yellow 89 and Solvent yellow 146; for disperse dyes, Disperse red 60, Disperse red 72, Disperse blue 56, Disperse blue 60 and Disperse yellow 60; and the like.

Among these dyes, metal complex oil soluble dyes having particularly superior heat resistance and light stability are preferred on use for the color filter material.

The pigment may be once dispersed by alcohol solution of metal alkoxide and then made into a sol or, alternatively, it may be dispersed in sol solution. When it is used for the color filter material, it is preferred that it is dispersed into the grain size smaller than the length of visible light wavelength. The examples of C.I.Nos. of the pigment preferred in use for the present invention are given below: Pigment red 220, Pigment red 221, Pigment red 53:1, Pigment blue 15:3, Pigment blue 60, Pigment green 7 and Pigment violet 37.

For the material of colored sol, such metal alkoxide as Si, Al, Zr, Ti etc. which are generally used for sol-gel method may be used. Particularly, the colored sol using alkoxide of silica which is easy to handle is preferred in the present invention.

For instance, when tetraethoxysilane is dissolved in a mixed solvent of alcohol-water and after dissolution or dispersion of color or pigment in such solution, acid is added and the mixture is stirred for 2 hours at room temperature, tetraethoxysilane is hydrolyzed, dehydrated and condensed to become uniformly colored silica sol.

The preferred composition of colored sol may be such that 100 wt parts of ethyl silicate is coupled with 50–200 wt parts of ethanol, 50–200 wt parts of water, 0.1–3 wt part of hydrochloric acid and 0.5–25 wt part of pigment. In some cases, water-soluble organic solvent, for example, acetonitrile, dioxane, tetrahydrofuran may be added.

According to the pattern forming method of the present invention, a first polysilane layer is formed on a suitable transparent substrate. There is no particular restriction on the transparent substrate as long as it is resistant to organic solvent and its transparency does not deteriorate even after dyeing. To be more specific, polyester film, polyether sulfon film and glass substrate etc. are suitable for this use. The use of glass sheet for the substrate is particularly preferred. The thickness of the substrate may be changed depending on the strength of the material of construction. For instance, when glass sheet is used, those with a thickness in the range of 0.6–1.2 mm are preferred from the viewpoint of the strength of the material for the color filter.

The polysilane layer is formed on such transparent substrate. As long as it is possible to form a polysilane layer with uniform thickness, there is no particular restriction on the method of forming. Generally speaking, it is preferred to use a spin-coating method.

As aforesaid, by coating the solution containing polysilane, and upon necessity a bridging agent on the substrate and drying, a filter material with a polysilane layer formed on the transparent substrate is obtained. There is no particular restriction on the organic solvent used in the step of forming the polysilane layer as long as it is a volatile organic solvent which can dissolve polysilane. Toluene and n-decane are preferred for use. It is preferred to form the polysilane layer with a dry thickness in the range of 1–10 μm.

An example of the steps used to color the obtained filter material into multi-color pattern is shown in (a)–(f) of FIG. 1. As shown in FIG. 1(a), the filter material 104 composed of substrate 101 and polysilane layer 102 obtained as aforesaid are irradiated according to the pattern using a UV radiation source such as a mercury lamp. UV radiation 110 is conducted through mask film 103 of the pattern overlapped on the filter material 104.

UV radiation used in the present invention has the wavelength of 300–400 nm which is the $\sigma$–$\sigma$* absorption zone of polysilane. The irradiation with such UV radiation is conducted preferably with a light intensity of 0.5–10 J/cm$^2$. When the irradiation light intensity is less than 0.5 J/cm$^2$, the coloring property deteriorates, while if it is over 10 J/cm$^2$, generation of pinhole increases.

Si—Si bonds which exist in the polysilane layer are broken by UV irradiation to produce SiOH (silanol group). Therefore, latent images containing silanol groups are formed on the irradiated filter material according to the pattern.

Then by immersing the filter material on which the latent image containing silanol group is formed in a dye bath or applying a colored sol solution, the pattern section of the filter material is dyed. For the dye bath, an aqueous solution of dye which contains 0.1–2 wt % of at least one type of the dyes used in the present invention (for instance the dyes shown in Formula (I)–(V)) is preferred. In order to swell the polysilane layer and to increase coloring speed and coloring strength, water-soluble organic solvent such as acetonitrile, dioxane and tetrahydrofuran may be added. The preferred content of such water-soluble organic solvent in the dye bath may be 1–20 wt %. When the content of solvent is over 20 wt %, partial re-dissolution of the polysilane layer occurs and irregularity may be produced at the surface of the obtained dyed filter material.

Dyeing conditions such as coloring temperature and coloring time may be changed depending on the desired strength of coloring and the kind and quantity of dyes used. However, if the filter material should be immersed in the dye bath or coloring sol solution at too high a temperature for a prolonged period, partial re-dissolution of the polysilane layer occurs and irregularity may be produced at the surface of the obtained colored filter material. According to the present invention, the preferred practice of dyeing may be conducted, by immersing the filter material in the dye bath or colored sol solution heated to 20°–40° C. for 5–40 minutes.

Colored filter material is dried after removing the dye solution or coloring sol liquid. For removal, water washing or blowing by air may be usable. In the first embodiment drying may be carried out by having the filter stand free in a chamber, but the preferred way is to conduct forced drying, by heating it for 5–30 min. at 50°–100° C. In the second embodiment, in order to further promote gelation of colored sol granules adsorbed on the exposed part the polysilane layer, the filter is dried for 10 min. to one hour at a temperature of over 100° C. Under such conditions coloring matter or pigment are confined in the bridged SiO$_2$ film and does not cause elution into organic solvent etc. In the subsequent coloring process, no coloring occurs at this part.

Figure 1B:
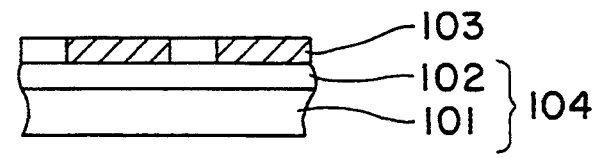

Drying temperature is preferred to be as high as possible within the range of tolerance of substrate, dyes and pigment, and the colored film dries with a higher hardness and resistance and superior quality. When glass substrate and pigment are used, it may be dried at 200° C. for over 30 min. As a result of such first pattern coloring step, a filter material 104 pattern-colored in one desired color is obtained as shown in FIG. 1(b).

Figure 1C:
Figure 1D:

When a filter material pattern-colored in multi-colors like a color filter is desired, other than the mask film 113 is used instead of mask film 103, and the latent image of different color pattern is formed on the polysilane layer as shown are FIG. 1(c), and the dyes or pigments indicating other colors are used. The process is conducted in the same manner as in the said 1st pattern coloring process and the filter material 104'' pattern-colored in the desired two colors is obtained (the 2nd pattern coloring step). The mask film 113 used here has in general such a mask pattern that the pattern of the polysilane layer colored in the aforesaid first pattern coloring process is covered, and uncolored part is exposed.

Figure 1E:
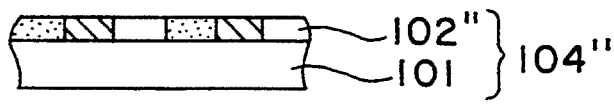
Figure 1F:

Further, when it is so desired, the image of different color pattern is formed on the polysilane layer using mask film 123 instead of mask film 113 as shown in FIG. 1(e), and dye or pigments indicating other colors are used. The process is conducted in the same way as in the aforesaid second pattern coloring step and thus the filter material 104'' which is pattern-colored in the desired 3 colors is obtained (the 3rd pattern-coloring step). The mask film 123 used here has in general such a mask pattern that the pattern part of the polysilane layer colored in the aforesaid 1st pattern coloring process and in the 2nd pattern-coloring process are covered and the uncolored part is exposed as shown in FIG. 1(e).

By repeating such process, it is possible to manufacture the filter material pattern-colored in many more colors. In the examples shown here, the colored patterns formed on the polysilane layer in the 1st, 2nd and 3rd pattern coloring processes are formed without causing overlapping of patterns.

The wording in this specification "to form the latent images of the different color patterns" means that in the respective pattern coloring step, the latent image of the exact identical color pattern is not formed, but it does not mean to restrict the process to the forming of color patterns which do not overlap with each other. Furthermore, the wording in this specification "different dyes or pigments are used" means to use in each pattern-coloring step, a coloring sol solution having different color shades containing at least one type of dye or pigment, and a part of the dye or pigment composition used for sol solution may be overlapping and furthermore, the wording in this specification "different basic dyes are used" means in each pattern-dyeing step, that the dye bath having a different color shade contains at least one type of basic dye and a part of the dye composition used for the dye bath in each step may be overlapping.

In the present invention, since the pattern section of once colored and dyed polysilane layer contains practically no silanol group, it is hardly dyed by other dyes in the subsequent dyeing step. Therefore, according to the method of the present invention, the problem of color mixing hardly occurs. In order to ensure that color mixing of dyed pattern, is prevented in the said 1st, 2nd and 3rd dyeing step where different dye is used, it is desirable to do carry out the dyeing step one after the another from the dyes having faster adsorption speed. The adsorption speed of the dyes used in the present invention is determined by the silica gel chromatography.

By the same reason, it is preferred that the UV radiation exposure dosage is increased in the order of the 1st, 2nd and 3rd pattern dyeing step. This method is particularly useful in the case when different dyes with roughly the same adsorption speed are used. By the simple and convenient method as aforesaid, color mixing which is a serious problem in the manufacture of color filter can be avoided. As a result, it becomes unnecessary to coat the respective colored parts individually which has been necessary in the conventional processes of manufacturing color filters.

In the 2nd embodiment, the pattern section of the polysilane layer dyed and dried disappears due to condensation of silanol group and sol granule and, therefore, it is not colored in the subsequent coloring step by other dyes and pigments. Through such a simple and convenient process, mixing of colors which have been a serious problem in the manufacture of color film is prevented. As a result, the step of coating the respective colored section which has been required in the conventional processes in of the manufacture of color filters has become unnecessary.

As aforesaid, in the case of the pattern coloring method of the present invention, the photolithography process which includes the wet developing step is not required for forming of colored pattern. Besides, since the pattern-colored filter material obtained in this method is composed of a single polysilane layer formed on the transparent substrate, the surface becomes an essentially flat surface. Therefore, the step of grinding to make the surface smooth and the step of coating the smoothed layer on the surface is not required. Further, it does not require the use of an anti-staining layer for prevention of color mixing. As a result, the step of forming a colored pattern is remarkably simplified.

The filter material pattern-colored has a flat surface, and mixing of color patterns does not occur and therefore a pattern with superior precision is obtained.

Furthermore, since metal complex dyes or pigments with superior heat resistance and light stability are used for coloring, it is possible to prevent deterioration of coloring material in the heating process during the manufacture of color display.

The present invention is particularly preferred for the manufacture of color filter used for color liquid crystal display. For such purpose, in the aforesaid 1st, 2nd and 3rd pattern coloring steps, dyes or pigments which correspond to 3 original RGB colors are respectively used. It is also possible to form black stripes by using black dye or pigment in the 4th coloring step. Naturally, this 4th pattern coloring step is not necessarily after coloring of 3 original RGB colors. Pattern coloring of RGB 3 original colors may be conducted on the filter material on which black stripes are formed beforehand.

EXAMPLES

The present invention is illustrated by the examples given below but the present invention is not limited thereto. "%" and "parts" as used in the examples of the present invention are all weight-based.

Preparation Example 1

400 ml of toluene and 13.3 g of sodium were charged in 1,000 ml flask equipped with an agitator. After finely dispersing sodium in toluene by a high speed agitation, 51.6 g of phenylmethyl dichlorosilane was added thereto. Subsequently, the content of the flask was heated to 111° C. In a yellow room where UV radiation is blocked, and mixed for 5 hrs to cause polymerization. Thereafter, ethanol was added to the obtained reaction mixture to inactivate excessive sodium, and rinsed with water to separate an organic layer. By charging this organic layer into ethanol, polysilane was precipitated. Through repeating recrystallization of thus obtained crude poly(phenylmethylsilane) three times in ethanol, poly(phenylmethylsilane) with a weight average molecular weight of 200,000 was obtained.

Preparation Example 2

Other than that an agitation time is set for 3 hrs, the process was conducted in the same way as in Preparation Example 1 and poly(phenylmethylsilane) with molecular weight of 10,000 was obtained.

Preparation Example 3

Other than that 25.8 g of phenylmethyl dichlorosilane and 28.5 g of methyltrifluoropropyl dichlorosilane were used instead of phenylmethyl and, the process was conducted in the same way as in Preparation Example 1 and phenylmethyl/methyltrifluoropropyl (1/1) copolysilane with molecular weight of 60,000 was obtained.

Example 1

A 5% toluene solution of poly(phenylmethylsilane) obtained in Preparation Example 1 was coated on a glass substrate of 5 cm (length)×5 cm (width)×0.11 cm (thickness) by a spin coater ("PRS-14E" manufactured by Dinapart Corp.). Subsequently, the coated film was dried to form a polysilane layer of 2 μm in thickness.

A silver salt negative film on which a transmission pattern for blue color on the color filter had been formed was pieced on the coated film (filter material) and was exposed to UV radiation with light intensity of 4.8 g/cm$^2$ using a medium pressure mercury lamp. After removal of the silver salt negative film, the filter material on which the latent image was formed was immersed in an aqueous acetonitrile solution containing 10% of acetonitrile and 1% of a triphenylmethane type dye called Victoria Blue BH manufactured by Hodogaya Chemical Co. Immersion was continued for 20 minutes at 25° C. Subsequently the filter material was taken out of the dye bath, rinsed with water and dried for 20 minutes at 80° C. and thus the filter material, pattern-dyed in blue color, was obtained (the 1st pattern dyeing process).

Thereafter other than that, a silver salt negative film on which a transmission pattern for red color on the color filter had been formed was used instead of the silver salt negative film blue color and a methine type dye called Astra Phloxine FF conc. manufactured by Hodogaya Chemical Co. was used instead of Victoria Blue BH. The rest of the process was conducted in the same way as in the 1st pattern dyeing process, and the filter material pattern-dyed in blue and red colors was obtained (the 2nd pattern dyeing process).

Thereafter, other than that, UV radiation exposure is made with a light intensity of 6.0 J/cm$^2$ using the silver salt negative film on which transmitting pattern for green color of the color film was formed instead of the silver salt negative film for blue color and a triphenylmethane dye called Brilliant Basic Cyanine 6GH 0.5% manufactured by Hodogaya Chemical Co. and methine dye called yellow 7GL 0.7% manufactured by Hodogaya Chemical Co. were used instead of Victoria Blue BH. The rest of the process was conducted in the same way as in the 1st pattern dye process and a color filter pattern dyed in blue, red and green colors was obtained (the 3rd pattern dyeing process).

Thus obtained color filter was evaluated in regard to color mixing ability, appearance of dyed surface and light transmission rate. The results are shown in Table 1.

As for the color mixing ability, spectroscopic transmission rate of each pixel on the visible region was measured and the result was compared with the spectroscopic transmission rate obtained in the independent dyeing, and when the difference (difference in transmission rate) was less than 10%, it was rated "O" and when it was over 10%, it was rated "X".

The appearance of the dyed surface was evaluated by visually observing the presence of pinholes, dirts and irregularity of dyeing at the dyed surface of the polysilane layer. When the conditions are good, it was rated "O" and when it was fair, the rating was "Δ" and when inferior, the rating was "X".

As for the light transmission rate, the rate at the maximum absorption wavelength of each pixel formed was measured. When light transmission rate is less than 5%, it may be used favorably as a color filter.

Example 2

Other than that, the poly(phenylmethylsilane) with a molecular weight of 10,000 obtained in Preparation Example 2 was used instead of the poly(phenylmethylsilane) with molecular weight of 200,000. The rest of the process was conducted in the same way as in Example 1, and the color filter was obtained. Color mixing ability, appearance of the dyed surface and light transmission rate of the thus obtained color filter were evaluated. The results are shown in Table 1.

Example 3

Other than that the polysilane layer was made to contain 1% of silicone rubber composition which comprised 99 parts of dimethylsilicone oil (silicone oil "YF3802" manufactured by Toshiba Silicone Corp.), one part of methyltriacetoxysilane and 0.1 part of dibutyltin dilaurate, and the rest of the process was conducted in the same way as in Example 2 and the color filter was obtained. Color mixing ability, appearance of dyed surface and light transmission rate of the thus obtained color filter were evaluated. The results are shown in Table 1.

Example 4

Other than that, the phenylmethyl/methyltrifluoropropyl (1/1) copolysilane with a molecular weight of 60,000 obtained in Preparation Example 3 was used instead of the poly(phenylmethylsilane) with molecular weight of 200,000, and the rest of the process was conducted in the same way as in Example 1 and the color filter was obtained. Color mixing ability, appearance of dyed surface and light transmission rate of the thus obtained color filter were evaluated.

The results are shown in Table 1.

TABLE 1

| | Color mixing ability | Appearance | Light transmission | | | Remarks |
|---|---|---|---|---|---|---|
| | | | R | G | B | |
| Example 1 | O | O | 3% | 2% | 3% | — |
| Example 2 | O | Δ | 4% | 3% | 5% | *1 |
| Example 3 | O | O | 4% | 4% | 4% | *2 |
| Example 4 | O | O | 4% | 5% | 4% | *3 |

*1 Irregular dyeing due to decrease of molecular weight
*2 Irregular dyeing was prevented by formulating silicone rubber.
*3 Irregular dyeing was prevented by adding a fluorine based polysilane.

Example 5

A 5% toluene solution of poly(phenylmethylsilane) obtained in Preparation Example 1 was coated on a glass substrate of 5 cm (length)×5 cm (width)×0.11 cm (thickness) by a spin coater ("PRS-14E" manufactured by Dinapart Corp.). By drying the thus coated film, a polysilane layer of 2 μm in thickness was formed.

A silver salt negative film on which transmission pattern for red color of the color filter was placed on the filter material obtained above, and was exposed to UV ray with light intensity of 4.8 J/cm$^2$ using a medium pressure mercury lamp. After removal of the silver salt negative film, the filter material on which a latent image was formed was immersed in the colored sol solution as described below.

The color sol solution was prepared by dissolving 1 g of a basic dye called Astra Phloxine FF conc. manufactured by Hodogaya Chemical Co. in a solution composed of 25 g of tetraethoxysilane, 38 g of ethanol and 24 g of water, followed by addition of 0.3 g of hydrochloric acid. It was then mixed for 2 hrs at room temperature, into which 80 g of water and 10 g of acetonitrile were added.

Immersion of the filter material in the color sol solution was conducted at 25° C. for 10 min. Subsequently, filter material was taken out of the colored sol solution, washed with water and dried at 110° C. for 30 min., thus obtaining the filter material pattern-colored in red (the 1st pattern coloring process).

Subsequently, other than that, a silver salt negative film on which transmission pattern for blue color of the color film had been formed was used instead of the silver salt negative film for red color and a basic dye called Victoria Blue BH manufactured by Hodogaya Chemical Co. was used instead of Astra Phloxine FF conc. The rest of the process was conducted in the same way as in the 1st pattern dyeing process and the filter material pattern colored in blue and red colors was obtained (the 2nd pattern coloring process).

Subsequently, other than that, the silver salt negative film on which transmission pattern for green color of the color filter had been formed was used instead of the silver salt negative film for red color and was exposed to UV ray with light intensity of 4.8 J/cm$^2$ and 0.4 g of a basic dye called Brilliant Basic Cyanine 6GH manufactured by Hodogaya Chemical Co. and 0.6 g of a basic dye called Yellow 7GLH were used instead of Astra Phloxine FF. The rest of the process was conducted in the same way and in the 1st pattern coloring step and the color filter pattern colored in red, blue and green colors was obtained (the 3rd pattern coloring step).

Color mixing ability, light transmission rate and heat resistance of the thus obtained color filter were evaluated. The results are shown in Table 2.

As for the color mixing ability, spectroscopic transmission rate of each pixel in the visible region was measured and the result was compared with the spectroscopic transmission rate obtained in the independent dyeing, and when the difference (difference in transmission rate) was less than 10%, it was rated "O" and when it was over 10%, it was rated "X".

The heat resistance was evaluated by the maximum heat resistance temperature (holding time was one hour) wherein the degree of color fading measured by the transmission rate of maximum absorption wavelength becomes less than 5.

As for the light transmission rate, the rate at the maximum absorption wavelength of each pixel formed was measured.

Example 6

In the same manner as described in Example 5, an evaluation was conducted, with the exception that 1 g of Astra Phloxine FF was changed to Orasol red G manufactured by Ciba Geigy Co., 1 g of Victoria Blue BH was changed to Varifast Blue 1607 manufactured by Orient Chemical Industries Ltd., 0.5 g of Brilliant Basic Cyanine GH was changed to 0.5 g of Orasol Blue GN and 0.7 g of Yellow 7GLH was changed to 0.5 g of Orasol Yellow 2RLN available from Ciba Geigy Co.

Example 7

In the same manner as described in Example 5, an evaluation was conducted, with the exception that the red coloring material was changed to 2 g of Miketon Polyester Red FL, the blue coloring material was changed to 2 g of Miketon Polyester Blue FBL, green coloring material was changed to a mixture of 1 g of Miketon Polyester Brilliant Blue BG and 1 g of Miketon Polyester Yellow GPL (all Miketons are available from Mitsui Toatsu Chemicals Inc.).

Example 8

Preparation of colored sol

Colored sol for red color was prepared by adding 10 g of pigment called Microlith Red 2BWA manufactured by Ciba Geigy Co. to the solution composed of 25 g of tetraethoxy silane, 25 g of ethanol and 17 g of water followed by addition of 100 g of glass beads and after dispersing the solution at 20° C. for 30 min., 0.3 g of hydrochloric acid was added thereto and it was dispersed for 2 hours at 20° C. Sol solution of the same composition to which no coloring material was added was prepared and 30 g of such sol solution was mixed with 10 g of colored sol followed by addition of 30 g of water to prepare the sol solution for coloring.

Pigment for blue color: 10 g of Microlith Blue 4GWA manufactured by Ciba Geigy Co.

Pigment for green color: 10 g of Irgalite Green GLN New Manufactured by Ciba Geigy Co.

Drying temperature: 110°–200° C.

Other than the above, the process was conducted in the same way as in the Example 5.

Comparative Example 1

Without using colored sol solution, dyeing was conducted using aqueous solution of coloring material (0.6 g coloring material 90 g of water and 10 g of acetonitrile).

Other than that, the process was conducted in the same way as in the Example 5.

Comparative Example 2

Without using colored sol solution, dyeing was conducted using aqueous solution of coloring material (0.3 g of coloring material, 80 g of water and 20 g of acetonitrile).

Other than that, the process was conducted in the same way as in Example 7.

TABLE 2

| | Color mixing ability | Heat resistance (°C.) | Light transmission | | | Remarks |
| --- | --- | --- | --- | --- | --- | --- |
| | | | R | G | B | |
| Example 5 | O | 140 | 3% | 5% | 3% | *4 |
| Example 6 | O | 180 | 2% | 5% | 2% | *5 |
| Example 7 | O | 160 | 5% | 6% | 3% | *6 |
| Example 8 | O | 240 | 3% | 6% | 4% | *7 |
| Comp. Ex. 1 | X | 120 | — | 7% | — | *8 |
| Comp. Ex. 2 | X | 160 | — | — | — | *9 |

*4 Basic dye
*5 Solvent dye
*6 Disperse dye
*7 Pigment
*8 R and B are mixed.
*9 All colors are mixed.

The present invention provides the color pattern forming method which is simple in process and therefore can manufacture the product at low cost to obtain an RGB color filter with superior pattern precision.

What is claimed is:

1. Method of forming multi-color dyed pattern on a polysilane layer comprising the following steps:
   a) a latent image forming step to form a latent image of dyed pattern by selectively exposing a polysilane layer formed on a substrate to UV radiation, said polysilane layer comprising polysilane with the chemical structure indicated by the formula:

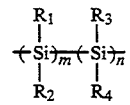

wherein, $R_1$, $R_2$, $R_3$ and $R_4$, respectively, are selected from the group consisting of a substituted or non-substituted aliphatic hydrocarbon group, an alicyclic hydrocarbon group and an aromatic hydrocarbon group, and m and n are integral numbers, b) a pattern dyeing step wherein said polysilane layer from step a) on which the latent image of dyed pattern is formed is immersed in a dye bath containing at least one type of basic dye,
   c) another pattern dyeing step conducted at least once in the same way as in the aforesaid pattern dyeing step except that images of different dyed patterns are formed in said polysilane layer and different types of basic dye are used, having different speeds of absorption on the polysilane layer and
   d) at least twice repeating;said pattern dyeing, one after another, starting with the pattern dyeing step which uses a dye having the fastest speed of adsorption on the polysilane layer.

2. The process of claim 1, wherein the polysilane has a molecular weight of over 10,000.

3. The process of claim 1, wherein the polysilane layer is from about 1 to 10 μm thick.

4. The process of claim 1, wherein the polysilane layer contains a crosslinking agent.

5. A color filter for a liquid crystal display comprising a color pattern on a transparent substrate prepared by the method of claim 1.

6. Method of forming multi-color dyed pattern on a polysilane layer comprising the following steps:
   a) a latent image forming step to form a latent image of dyed pattern by selectively exposing a polysilane layer formed on a substrate to UV radiation, said polysilane layer comprising polysilane with the chemical structure indicated by the formula:

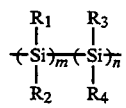

wherein, $R_1$, $R_2$, $R_3$ and $R_4$, respectively, are selected from the group consisting of a substituted or non-substituted aliphatic hydrocarbon group, an alicyclic hydrocarbon group and an aromatic hydrocarbon group, and m and n are integral numbers, b) a pattern dyeing step wherein said polysilane layer from step a) on which the latent image of dyed pattern was formed, is immersed in a bath of a colored sol solution comprising a metal alkoxide and at least one type of dye or pigment; and c) another pattern dyeing step conducted at least once in the same way as in the aforesaid pattern dyeing step except that images of different dyed patterns are formed in said polysilane layer using sol solutions comprising different types of dyes or pigments.

7. A color filter for a liquid crystal display comprising a color pattern on a transparent substrate prepared by the method of claim 6.

* * * * *